United States Patent
Song et al.

(10) Patent No.: US 9,018,776 B2
(45) Date of Patent: Apr. 28, 2015

(54) HARDMASK COMPOSITION INCLUDING AROMATIC RING-CONTAINING COMPOUND, METHOD OF FORMING PATTERNS, AND SEMICONDUCTOR INTEGRATED CIRCUIT DEVICE INCLUDING THE PATTERNS

(75) Inventors: Jee-Yun Song, Uiwang-si (KR); Min-Soo Kim, Uiwang-si (KR); Hwan-Sung Cheon, Uiwang-si (KR); Seung-Bae Oh, Uiwang-si (KR); Yoo-Jeong Choi, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/241,479

(22) Filed: Sep. 23, 2011

(65) Prior Publication Data

US 2012/0153511 A1 Jun. 21, 2012

(30) Foreign Application Priority Data

Dec. 16, 2010 (KR) ........................ 10-2010-0129101

(51) Int. Cl.
| H01L 23/498 | (2006.01) |
| H01L 21/308 | (2006.01) |
| C09D 7/12 | (2006.01) |
| H01L 21/311 | (2006.01) |
| H01L 21/02 | (2006.01) |
| H01L 21/027 | (2006.01) |
| G03F 7/09 | (2006.01) |

(52) U.S. Cl.
CPC .... H01L 21/31144 (2013.01); H01L 21/02118 (2013.01); H01L 21/02282 (2013.01); H01L 21/0271 (2013.01); G03F 7/094 (2013.01)
USPC .............. 257/786; 257/E23.06; 257/E21.232; 257/E21.219; 257/E27.009; 257/499; 438/703; 106/287.26; 430/323; 430/31; 430/317

(58) Field of Classification Search
CPC ..... H01L 23/498; H01L 21/308; H01L 27/02; G03F 7/094
USPC .................. 257/499, E21.219, E27.009, 786, 257/E23.06, E21.232; 525/553, 594, 610, 525/595, 582, 494, 491, 492, 398, 510; 430/323, 31, 317, 271.1, 272.1; 252/500, 62.54; 438/703; 106/287.26
See application file for complete search history.

(56) References Cited

U.S. PATENT DOCUMENTS

| 7,157,205 | B2 | 1/2007 | Adegawa |
| 7,510,820 | B2 | 3/2009 | Hatakeyama et al. |
| 7,655,386 | B2 * | 2/2010 | Hyung et al. ................. 430/313 |
| 7,659,051 | B2 * | 2/2010 | Yoon et al. .................... 430/313 |
| 7,881,594 | B2 * | 2/2011 | Fang et al. .................... 392/485 |
| 7,981,594 | B2 * | 7/2011 | Yoon et al. .................... 430/323 |
| 8,415,424 | B2 * | 4/2013 | Kim et al. ..................... 524/553 |
| 8,420,289 | B2 * | 4/2013 | Kim et al. .................. 430/270.1 |
| 8,445,187 | B2 * | 5/2013 | Yoon et al. .................... 430/323 |
| 8,637,219 | B2 * | 1/2014 | Cho et al. .................. 430/270.1 |
| 8,741,540 | B2 * | 6/2014 | Kim et al. .................. 430/270.1 |
| 2006/0269867 | A1 | 11/2006 | Uh et al. |
| 2008/0160460 | A1 * | 7/2008 | Yoon et al. .................... 430/323 |
| 2008/0160461 | A1 * | 7/2008 | Yoon et al. .................... 430/323 |
| 2010/0021830 | A1 * | 1/2010 | Kim et al. ......................... 430/5 |
| 2010/0119979 | A1 | 5/2010 | Rahman et al. |
| 2010/0133480 | A1 * | 6/2010 | Shin et al. ....................... 252/510 |
| 2010/0151382 | A1 | 6/2010 | Hatakeyama |
| 2010/0316950 | A1 | 12/2010 | Oguro et al. |
| 2011/0054063 | A1 | 3/2011 | Ooike et al. |
| 2011/0117501 | A1 * | 5/2011 | Song et al. ..................... 430/315 |
| 2011/0151376 | A1 * | 6/2011 | Rahman et al. ............ 430/270.1 |
| 2011/0155944 | A1 * | 6/2011 | Cho et al. ............... 252/62.51 R |
| 2011/0229828 | A1 * | 9/2011 | Yoon et al. .................... 430/323 |
| 2011/0275019 | A1 * | 11/2011 | Yoon et al. .................... 430/323 |
| 2012/0153424 | A1 * | 6/2012 | Oh et al. ....................... 257/499 |
| 2012/0156614 | A1 * | 6/2012 | Jeong et al. ................. 430/281.1 |
| 2012/0156622 | A1 * | 6/2012 | Chung et al. ................ 430/286.1 |
| 2012/0168894 | A1 * | 7/2012 | Kim et al. ..................... 257/499 |
| 2012/0171609 | A1 * | 7/2012 | Jeong et al. ................. 430/270.1 |
| 2012/0270994 | A1 * | 10/2012 | Kim et al. ..................... 524/553 |
| 2012/0322010 | A1 * | 12/2012 | Paulasaari .................... 430/325 |

FOREIGN PATENT DOCUMENTS

| CN | 101185030 A | 5/2008 |
| CN | 101641390 A | 2/2010 |

(Continued)

OTHER PUBLICATIONS

Search Report issued in corresponding application, TW 100141842, dated Oct. 11, 2013.

*Primary Examiner* — Alexander Oscar Williams
(74) *Attorney, Agent, or Firm* — Lee & Morse, P.C.

(57) ABSTRACT

A hard mask composition includes a solvent and an aromatic ring-containing compound represented by the following Chemical Formula 1:

[Chemical Formula 1]

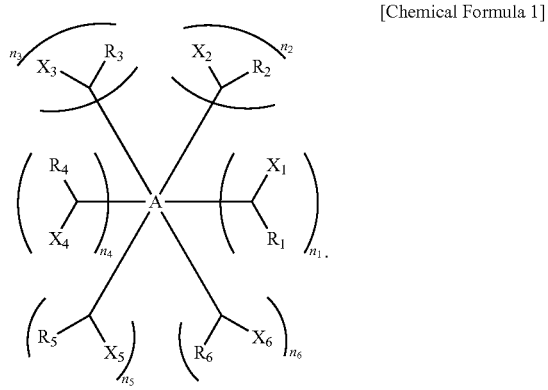

12 Claims, No Drawings

(56) References Cited

FOREIGN PATENT DOCUMENTS

| | | |
|---|---|---|
| CN | 101889247 A | 11/2010 |
| JP | 2010-117629 A | 5/2010 |
| KR | 10-2005-0004016 A | 1/2005 |
| KR | 10-2006-0108532 A | 10/2006 |
| KR | 10-2007-0055972 A | 5/2007 |
| KR | 10-2008-0107208 A | 12/2008 |
| KR | 10-2009-0068444 A | 6/2009 |
| KR | 10-2009-0120827 A | 11/2009 |
| KR | 1020100080139 A | 7/2010 |
| TW | 200936635 A | 9/2009 |
| TW | 201018713 A1 | 5/2010 |
| TW | 201019049 A1 | 5/2010 |
| WO | WO 2009/090916 A1 | 7/2009 |

\* cited by examiner

HARDMASK COMPOSITION INCLUDING AROMATIC RING-CONTAINING COMPOUND, METHOD OF FORMING PATTERNS, AND SEMICONDUCTOR INTEGRATED CIRCUIT DEVICE INCLUDING THE PATTERNS

BACKGROUND

1. Field

Embodiments relate to a hard mask composition, a method of forming patterns using the same, and a semiconductor integrated circuit device including the patterns.

2. Description of the Related Art

Industrial fields including microelectronics manufacturing as well as microscopic structure manufacturing, e.g., micromachines, magnetoresist heads, etc., need chips including many circuits with a decreased size of patterns. An effective lithography technique is essential in decreasing the size of patterns. Lithography affects the fabrication of a microscopic structure not only in terms of directly imaging a pattern on a predetermined substrate but also in terms of fabricating a mask typically used for such imaging.

A typical lithography process includes a process of forming a patterned resist layer by exposing a radioactive ray-sensitive resist to an imaging radioactive ray. Subsequently, a pattern image is obtained by developing the exposed resist layer with a developing solution. A pattern is then transferred onto an underlying material by etching the material in an opening of the patterned resist layer. After the transfer of the pattern, the remaining resist layer is removed.

SUMMARY

An embodiment is directed to a hard mask composition, including a solvent and an aromatic ring-containing compound represented by the following Chemical Formula 1:

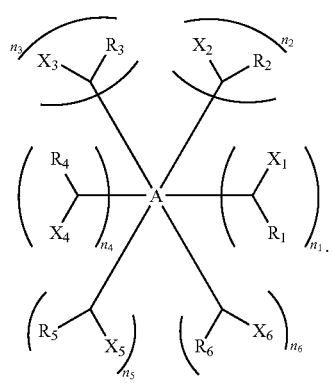

[Chemical Formula 1]

In Chemical Formula 1, A may be a substituted or unsubstituted aromatic cyclic group, $R_1$ to $R_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 an arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, $X_1$ to $X_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C1 to C30 alkoxy group, a substituted or unsubstituted C1 to C20 alkylamine group, an amino group, a hydroxy group, or a combination thereof, $n_1$ to $n_6$ may each independently be 0 or 1, and $n_1$ to $n_6$ may satisfy $1 \leq n_1+n_2+n_3+n_4+n_5+n_6 \leq 6$.

The A may be one selected from substituted or unsubstituted aromatic ring groups shown in the following Group 1:

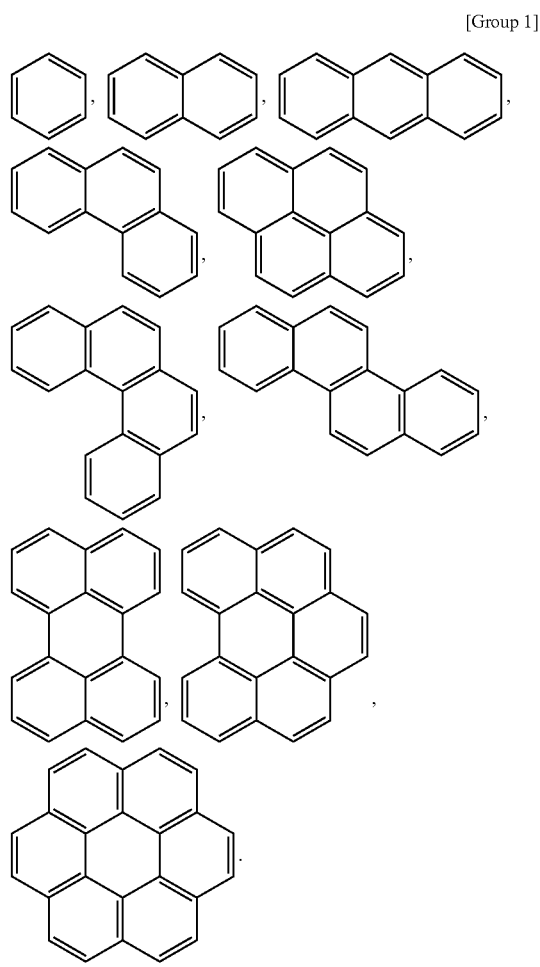

[Group 1]

The aromatic ring-containing compound may be a monomer.

The aromatic ring-containing compound may have a molecular weight of about 300 to about 4,000.

The aromatic ring-containing compound and the solvent may be included in an amount of about 1 wt % to about 20 wt % and about 80 wt % to about 99 wt %, based on the total amount of the hard mask composition, respectively.

The solvent may include at least one selected from propyleneglycol monomethyl etheracetate (PGMEA), propyleneglycol monomethylether (PGME), cyclohexanone, and ethyl lactate.

The aromatic ring-containing compound represented by Chemical Formula 1 may be selected from compounds represented by the following Chemical Formulae 1a-e:

[Chemical Formula 1a]

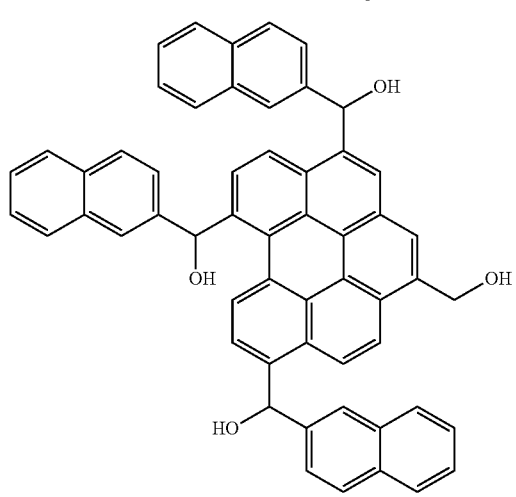

[Chemical Formula 1b]

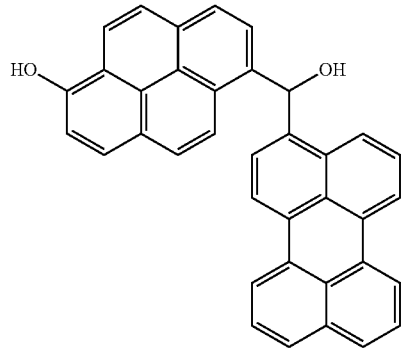

[Chemical Formula 1c]

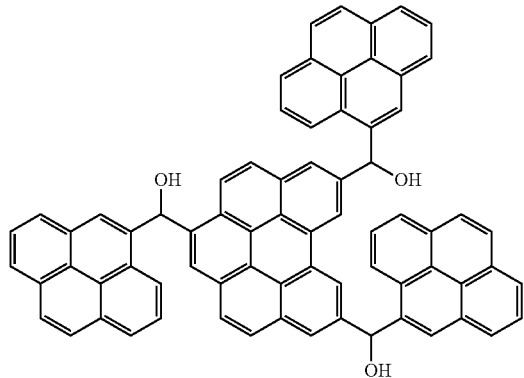

[Chemical Formula 1d]

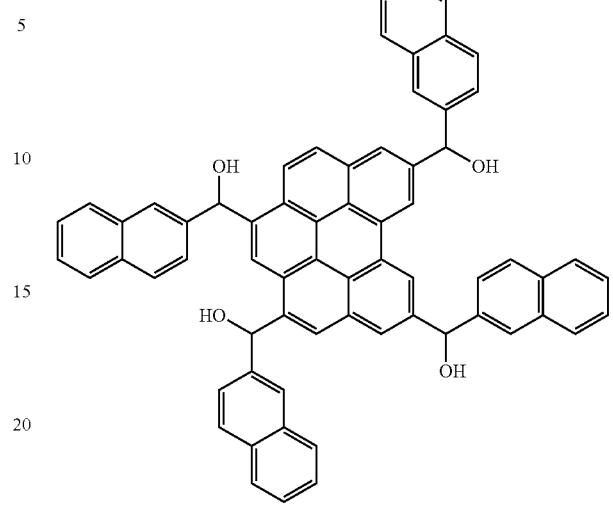

[Chemical Formula 1e]

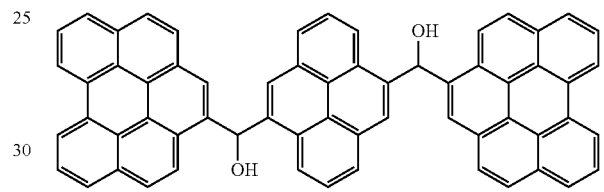

Another embodiment is directed to a method for forming a pattern, the method including providing a material layer on a substrate, forming a hard mask layer that includes an aromatic ring-containing compound represented by the following Chemical Formula 1 on the material layer, forming a resist layer on the hard mask layer, forming a resist pattern by exposing and developing the resist layer, selectively removing the hard mask layer by using the resist pattern, and exposing a part of the material layer, and etching the exposed part of the material layer,

[Chemcial Formula 1]

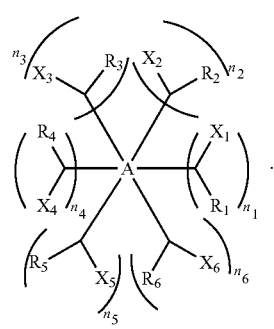

In Chemical Formula 1, A may be a substituted or unsubstituted aromatic cyclic group, $R_1$ to $R_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 an arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, $X_1$ to $X_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C1 to C30 alkoxy group, a substituted or unsubstituted C1 to C20 alkylamine group, an amino group, a hydroxy group, or a combination thereof, $n_1$ to $n_6$ may each independently be 0 or 1, and $n_1$ to $n_6$ may satisfy $1 \leq n_1+n_2+n_3+n_4+n_5+n_6 \leq 6$.

The A may be one selected from the substituted or unsubstituted aromatic ring groups shown in the following Group 1:

[Group 1]

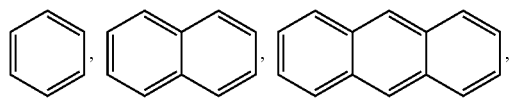

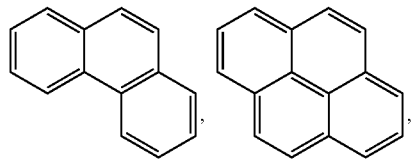

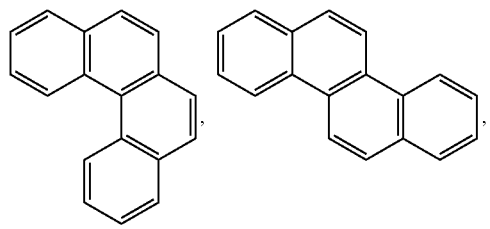

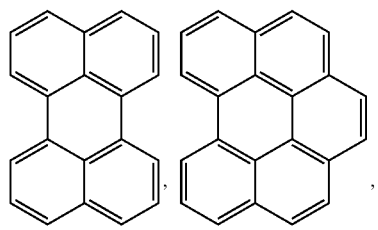

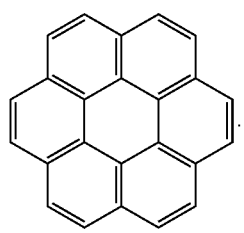

The aromatic ring-containing compound may be a monomer.

The aromatic ring-containing compound may have a molecular weight of about 300 to about 4,000.

The hard mask layer may be formed through a spin-on-coating process using a hard mask composition that includes the aromatic ring-containing compound represented by Chemical Formula 1 and a solvent.

The solvent may include at least one selected from propyleneglycol monomethyl etheracetate (PGMEA), propyleneglycol monomethylether (PGME), cyclohexanone, and ethyl lactate.

The method may further include forming an auxiliary layer containing silicon over the material layer before the resist layer is formed.

The method may further include forming a bottom antireflective coating layer (BARC) before the hard mask layer is formed.

Another embodiment is directed to a semiconductor integrated circuit device including a pattern formed through a method according to an embodiment.

DETAILED DESCRIPTION

Korean Patent Application No. 10-2010-0129101, filed on Dec. 16, 2010, in the Korean Intellectual Property Office, and entitled: "Hardmask Composition and Method of Forming Patterns and Semiconductor Integrated Circuit Device Including the Patterns," is incorporated by reference herein in its entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, when a definition is not otherwise provided, the term "substituted" may refer to one substituted with at least a substituent selected from a halogen (F, Br, Cl, or I), a hydroxy group, a C1 to C20 alkoxy group, a nitro group, a cyano group, an amino group, an azido group, an amidino group, a hydrazino group, a hydrazono group, a carbonyl group, a carbamyl group, a thiol group, an ester group, an carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C20 cycloalkyl group, a C3 to C15 cycloalkenyl group, a C6 to C15 cycloalkynyl group, a C1 to C20 heterocycloalkyl group, and a combination thereof.

As used herein, when a definition is not otherwise provided, the prefix "hetero" may refer to one including 1 to 3 heteroatoms selected from N, O, S, and P.

Hereinafter, a hard mask composition according to an example embodiment is described. The hard mask composition may include an aromatic ring-containing compound and a solvent.

In the present example embodiment, the aromatic ring-containing compound may be a compound represented by the following Chemical Formula 1.

[Chemical Formula 1]

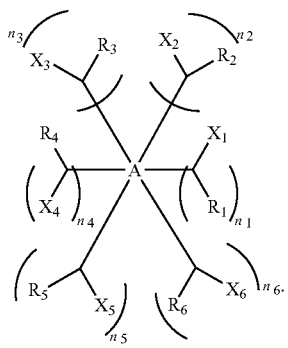

In Chemical Formula 1, A may be a substituted or unsubstituted aromatic cyclic group. $R_1$ to $R_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 an arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof. $X_1$ to $X_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C1 to C30 alkoxy group, a substituted or unsubstituted C1 to C20 alkylamine group, an amino group, a hydroxy group, or a combination thereof. $n_1$ to $n_6$ may each independently be 0 or 1, where $1 \leq n_1+n_2+n_3+n_4+n_5+n_6 \leq 6$.

In Chemical Formula 1 according to an example embodiment, A is an aromatic ring group, wherein the aromatic ring group refers to a cyclic group where electrons are delocalized or resonanced, and includes an aryl group, a heteroaryl group, or a combination thereof.

The A may be a substituted or unsubstituted aromatic ring group selected from the following Group 1.

[Group 1]

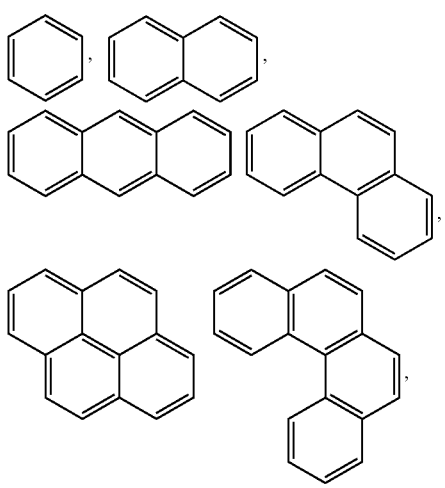

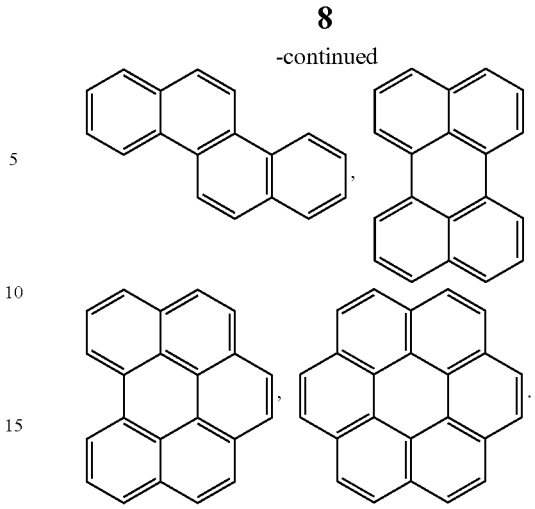

The aromatic ring group in the Group 1 may be linked to a substituent of the above Chemical Formula 1 at any position without limitation. In addition, at least one hydrogen linked to carbon in the aromatic ring group in Group 1 may be substituted with a substituent.

The aromatic ring group may absorb light of a predetermined wavelength region. In an implementation, the light of the predetermined wavelength region may be light of a short wavelength region, e.g., about 193 nm and/or about 243 nm.

The aromatic ring-containing compound represented by the above Chemical Formula 1 may be a monomer. The monomer-type aromatic ring-containing compound may undergo a cross-linking reaction at a high temperature without a particular catalyst and, thus, prevent contamination due to a catalyst. For example, contamination due to acid may be prevented.

The aromatic ring-containing compound may be a mixture of two or more aromatic ring-containing compounds having different substituents.

The aromatic ring-containing compound may have a molecular weight of about 300 to about 4,000. With the molecular weight of the above range, coating thickness may be realized by securing solubility and thus a good thin film may be provided.

The aromatic ring-containing compound may be included in an amount of about 1 wt % to about 20 wt %, based on the total amount of the hard mask composition. The aromatic ring-containing compound may be included in an amount of about 3 wt % to about 10 wt %, based on the total amount of the hard mask composition. When the aromatic ring-containing compound is included within the range, optical properties may be improved while ensuring application characteristics.

The solvent may be any solvent or mixture thereof that provides sufficient solubility or dispersion for the aromatic ring-containing compound. For example, the solvent may include at least one selected from propyleneglycol monomethyletheracetate (PGMEA), propyleneglycol monomethylether (PGME), cyclohexanone, and ethyl lactate.

The solvent may be included in an amount of about 80 wt % to about 99 wt %, based on the total amount of the hard mask composition. When the solvent is included within the above range, stable solubility may be ensured, and thus application properties may be improved.

In an implementation, the hard mask composition may include an additive such as a surfactant, and a cross-linking agent.

The surfactant may include, for example, an alkylbenzene sulfonate salt, an alkyl pyridinium salt, polyethylene glycol, a quaternary ammonium salt, etc.

The cross-linking agent promotes self cross-linking. Examples of the cross-linking agent include an amino resin, e.g., an etherificated amino resin; a glycoluril compound, e.g., a compound represented by the following Chemical Formula A; a bisepoxy compound, e.g., a compound represented by the following Chemical Formula B; a melamine resin, for example, N-methoxymethyl melamine resin, N-butoxymethyl melamine resin, or a compound represented by the following Chemical Formula C; or a mixture thereof.

[Chemical Formula A]

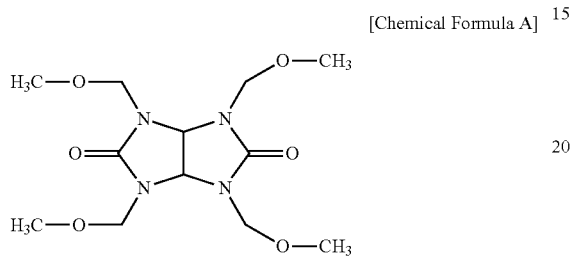

[Chemical Formula B]

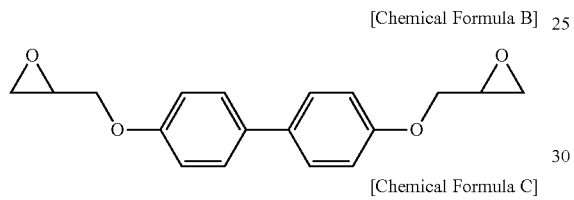

[Chemical Formula C]

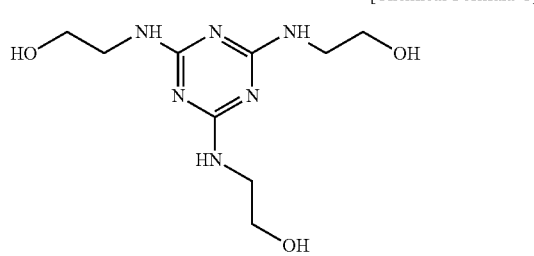

The surfactant and the cross-linking agent may be included in an amount of about 0.001 to about 1 part by weight based on 100 parts by weight of the hard mask composition, respectively. Within the amount range, the solubility and the cross-linking may be secured without changing the optical properties of the hard mask composition.

Hereafter, a method for forming patterns by using the above-described hard mask composition is described.

According to an example embodiment, a method of forming a pattern includes providing a material layer on a substrate, forming a hard mask layer using the hard mask composition, including an aromatic ring-containing compound and a solvent, on the material layer, forming a resist layer on the hard mask layer, exposing and developing the resist layer to provide a resist pattern, selectively removing the hard mask layer using the resist pattern to expose a part of the material layer, and etching the exposed material layer.

The substrate may be, for example, a silicon wafer, a glass substrate, or a polymer substrate.

The material layer is a material to be finally patterned, for example a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The hard mask layer may be formed by applying a hard mask composition according to an example embodiment. The hard mask composition may include an aromatic ring-containing compound and a solvent.

In the present example embodiment, the aromatic ring-containing compound may be a compound represented by the following Chemical Formula 1.

[Chemical Formula 1]

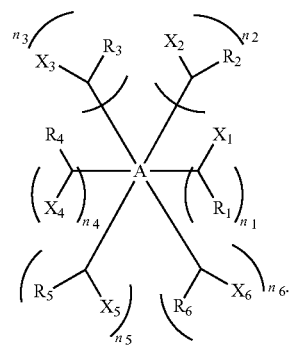

In Chemical Formula 1, A may be a substituted or unsubstituted aromatic cyclic group. $R_1$ to $R_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 an arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof. $X_1$ to $X_6$ may each independently be a substituted or unsubstituted C1 to C20 alkyl group, a substituted or unsubstituted C3 to C30 cycloalkyl group, a substituted or unsubstituted C6 to C30 aryl group, a substituted or unsubstituted C1 to C30 alkoxy group, a substituted or unsubstituted C1 to C20 alkylamine group, an amino group, a hydroxy group, or a combination thereof. $n_1$ to $n_6$ may each independently be 0 or 1, where $1 \leq n_1+n_2+n_3+n_4+n_5+n_6 \leq 6$.

In Chemical Formula 1 according to an example embodiment, A is an aromatic ring group, wherein the aromatic ring group refers to a cyclic group where electrons are delocalized or resonanced, and includes an aryl group, a heteroaryl group, or a combination thereof.

The A may be a substituted or unsubstituted aromatic ring groups shown in the following Group 1.

[Group 1]

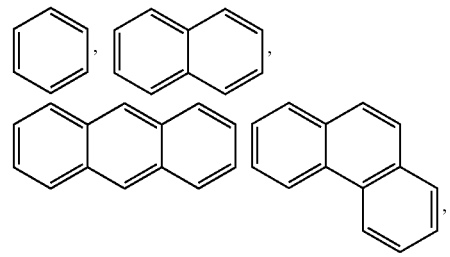

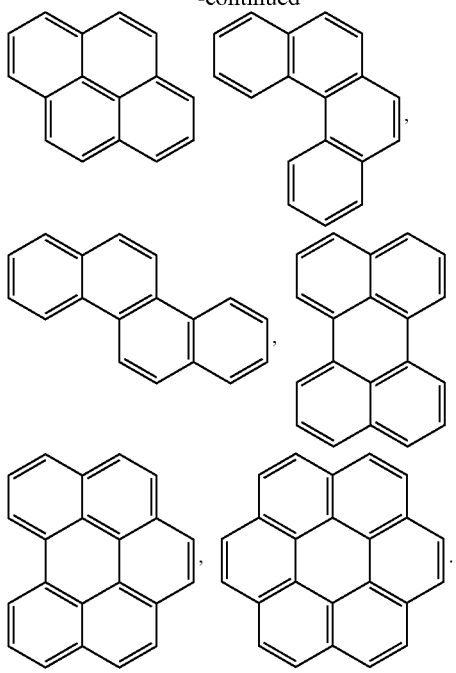

The aromatic ring group in Chemical Formula 1 may absorb light of a predetermined wavelength region, and the light of the predetermined wavelength region may be light of a short wavelength region, e.g., about 193 nm and/or about 243 nm.

The aromatic ring-containing compound represented by the above Chemical Formula 1 may be a monomer. The monomer-type aromatic ring-containing compound may have a cross-linking reaction at a high temperature with no particular catalyst and, thus, prevent contamination due to a catalyst. For example, contamination due to acid may be prevented.

The aromatic ring-containing compound may be a mixture of two or more aromatic ring-containing compounds having different substituents.

The aromatic ring-containing compound may have a molecular weight of about 300 to about 4,000. With the weight average molecular weight of the above range, coating thickness may be realized by securing solubility and thus a good thin film may be provided.

The aromatic ring-containing compound may be included in an amount of about 1 to about 20 wt %, based on the total amount of the hard mask composition. The aromatic ring-containing compound may be included in an amount of about 3 to about 10 wt %, based on the total amount of the hard mask composition. When the aromatic ring-containing compound is included within the range, the optical properties may be improved while securing good application characteristics.

The solvent may be any solvent or mixture thereof that provides sufficient solubility or dispersion for the aromatic ring-containing compound. For example, the solvent may include at least one selected from propyleneglycol monomethyletheracetate (PGMEA), propyleneglycol monomethylether (PGME), cyclohexanone, and ethyl lactate.

The solvent may be included in an amount of about 80 wt % to about 99 wt %, based on the total amount of the hard mask composition. When the solvent is included within the above range, stable solubility may be ensured, and thus application properties may be improved.

The hard mask composition may further include an additive such as a surfactant, and a cross-linking agent.

The hard mask composition may be prepared in the form of a solution and applied through a spin-on-coating process. Subsequently, the applied composition may be processed with a heat treatment so as to form a hard mask layer.

For example, the hard mask composition may be applied in a thickness of about 500 to about 7,000 Å, and the heat treatment may be performed at about 100 to about 500° C. for 10 seconds to 10 minutes.

Before the hard mask layer is formed, another auxiliary layer may be formed. Herein, the auxiliary layer may be a silicon-containing thin film. For example, the auxiliary layer may be a thin film formed of silicon nitride or silicon oxide.

Also, before the formation of the auxiliary layer, a bottom anti-reflective coating (BARC) layer may be further formed.

Subsequently, a resist layer may be applied onto the hard mask layer. The resist layer may be a radioactive ray-sensitive imaging layer including a photosensitive material.

Subsequently, a resist pattern may be formed by exposing and developing the resist layer.

Subsequently, the hard mask layer may be selectively removed using the resist pattern as a mask. Herein, when the auxiliary layer and/or the bottom anti-reflective coating layer are formed, they may be removed together. As a result, a part of the material layer may be exposed.

Subsequently, the exposed part of the material layer may be etched. Herein, the etching may be performed through a dry etching process using an etching gas, and the etching gas may be $CHF_3$, $CF_4$, $CH_4$, $Cl_2$, $BCl_3$, or a mixed gas thereof.

Subsequently, a plurality of patterns formed of the material layer may be formed by removing the hard mask layer and the resist layer with a typical stripper.

The multiple patterns may be diverse, such as a metal pattern, a semiconductor pattern, or an insulation pattern, and they may be diverse patterns inside a semiconductor integrated circuit device. When the semiconductor integrated circuit device includes the patterns, the patterns may be, for example, metal lines, semiconductor patterns, or insulation layers including contact holes, bias holes, and damascene trenches.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of an Aromatic Ring-Containing Compound

Synthesis Example 1

A 1 L three-necked flask with a mechanical agitator and a cooler was dipped in a 90° C. oil thermostat. Next, 30.6 g (0.1 mol) of hydroxymethyl benzoperylene, 57.19 g (0.3 mol) of 2-naphthoyl chloride, and 79.8 g (0.6 mol) of trichloroaluminum were added in 1,000 g of toluene. The solution was agitated for reaction with the agitator for 10 hours. When the reaction was complete, the trichloroaluminum was removed using water to obtain a compound, and 37.83 g (1.0 mol) of sodium borohydride was added to the compound. The mixture was reacted for 17 hours. After the reaction, a mixture of water and methanol was used to remove a reaction byproduct, obtaining an aromatic ring-containing compound represented by the following Chemical Formula 1a.

The aromatic ring-containing compound had a molecular weight of 770.

[Chemical Formula 1a]

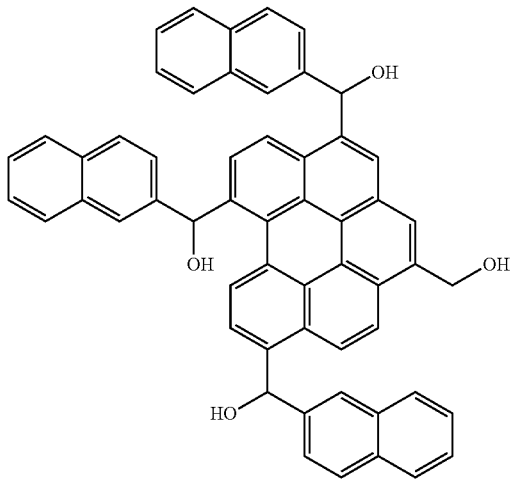

Synthesis Example 2

An aromatic ring-containing compound represented by the following Chemical Formula 1b was prepared according to the same method as in Synthesis Example 1 except for using 25.2 g (0.1 mol) of perylene instead of 30.6 g (0.1 mol) of hydroxymethylbenzo perylene and 26.4 g (0.1 mol) of pyrenoylchloride instead of 57.19 g (0.3 mol) of 2-naphthoyl chloride.

The aromatic ring-containing compound had a molecular weight of 498.

[Chemical Formula 1b]

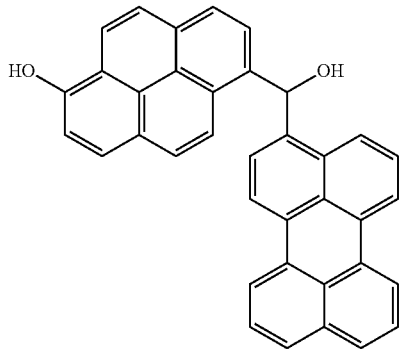

Synthesis Example 3

An aromatic ring-containing compound represented by the following Chemical Formula 1c was prepared according to the same method as in Synthesis Example 1 by using 27.6 g (0.1 mol) of benzoperylene instead of 30.6 g (0.1 mol) of hydroxymethylbenzoperylene and 79.2 g (0.3 mol) of pyrenoylchloride instead of 57.19 g (0.3 mol) of 2-naphthoyl chloride.

The aromatic ring-containing compound had a molecular weight of 966.

[Chemical Formula 1c]

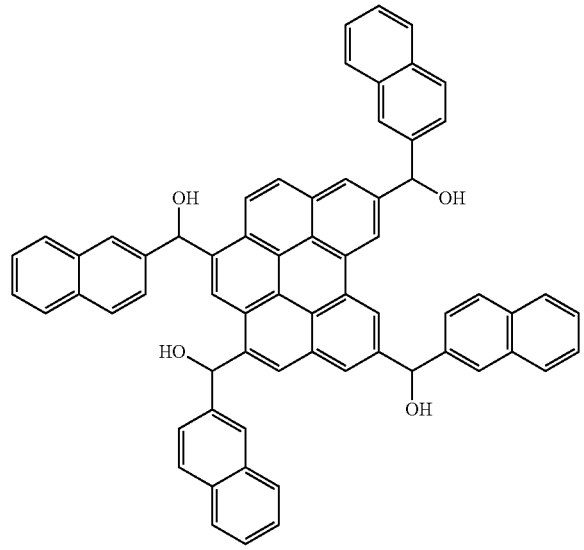

Synthesis Example 4

An aromatic ring-containing compound represented by the following formula 1d was prepared according to the same method as Synthesis Example 1 by using 27.6 g (0.1 mol) of benzoperylene instead of 30.6 g (0.1 mol) of hydroxymethylbenzoperylene and 76.25 g (0.4 mol) of 2-naphthoyl chloride instead of 57.19 g (0.3 mol) of 2-naphthoyl chloride.

The aromatic ring-containing compound had a molecular weight of 900.

[Chemical Formula 1d]

Synthesis Example 5

An aromatic ring-containing compound represented by the following formula 1e was prepared according to the same method as Synthesis Example 1 by using 20.2 g (0.1 mol) of pyrene instead of 30.6 g (0.1 mol) of hydroxymethylbenzoperylene and 67.61 g (0.2 mol) of benzoperylenoylchloride instead of 57.19 g (0.3 mol) of 2-naphthoyl chloride.

The aromatic ring-containing compound had a molecular weight of 810.

[Chemical Formula 1e]

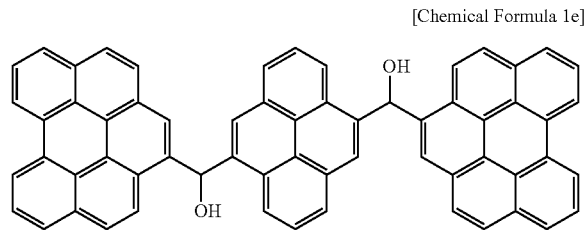 [SMILES: OC(c1cc2cccc3c(C(O)c4cc5ccc6cccc7c8cccc9ccc4c(c98)c5c67)cc4cccc1c4c23)c1cc2ccc3cccc4c5cccc6ccc1c(c65)c2c34]

Comparative Synthesis Example 1

While nitrogen gas was flowed in a 1 L 4-necked flask with a condenser, a mechanical agitator, a 300 ml funnel for adding in a dropwise fashion, and a nitrogen gas introducer, 8.75 g (0.05 mol) of α,α'-dichloro-p-xylene, 26.66 g of aluminum chloride, and 200 g of γ-butyrolactone were put therein and agitated together.

Ten minutes later, a solution prepared by dissolving 35.03 g (0.10 mol) of 4,4'-(9-fluorenylidene)diphenol in 200 g of γ-butyrolactone was added to the reactant dropwise. The mixture was agitated for polymerization at 115° C. for 13 hours.

After the reaction, water was used to remove acid from the polymerized reactant. The resulting product was concentrated with an evaporator. Then, methylamylketone and methanol were used to dilute the polymerized product, and 15 wt % concentration solution of methylamylketone/methanol at a weight ratio of 4/1 was added thereto to adjust its concentration. The resulting solution was put in a 3 L separatory funnel, and n-heptane was added thereto to remove low molecular weight products including a monomer, obtaining a polymer having a weight average molecular weight of 12,000 and polydispersity of 2.0 and represented by the following Chemical Formula 1f.

[Chemical Formula 1f]

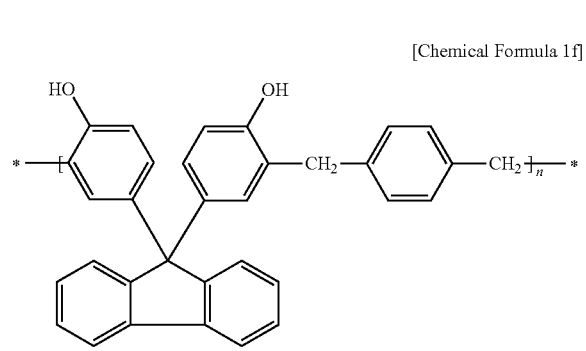 [SMILES: CCc1ccc(Cc2cc(C3(c4ccc(O)c(C)c4)c4ccccc4-c4ccccc43)ccc2O)cc1]

Comparative Synthesis Example 2

A 500 ml three-necked flask with a thermometer, a condenser, and a mechanical agitator was dipped in an oil thermostat in a temperature range of 90 to 100° C. Next, the thermostat was placed on a hot plate and agitated with a stirring bar, while maintaining the same temperature. Cooling water in the condenser was controlled to have a fixed temperature of 5° C.

Then, 28.32 g (0.14 mol) of pyrene, 28.83 g (0.2 mol) of 2-naphthol, and 12.08 g (0.4 mol) of paraformaldehyde were put in the 3-necked flask, and a solution prepared by dissolving 0.57 g (3 mmol) of p-toluene sulfonic acid monohydrate in 163 g of propyleneglycol monomethylether acetate (PGMEA) was also added to the three-necked flask. The mixture was agitated for polymerization for 18 hours.

Then, a specimen was sampled from the polymerized product by one hour. When it had a weight average molecular weight ranging from 2,500 to 3,500, the reaction was complete. Herein, the weight average molecular weight was measured by sampling 1 g of a specimen from the polymerized product and quenching it to a room temperature, and then taking 0.02 g of the specimen and diluting it using tetrahydrofuran (THF) until it had a solid content of 4 wt %.

When the polymerization reaction was complete, the reactant was slowly cooled down to a room temperature.

The reactant was put in 40 g of distilled water and 400 g of methanol. The mixture was strongly agitated and then allowed to stand. Next, after removing a supernatant, a precipitate was dissolved in 80 g of propyleneglycol monomethylether acetate (PGMEA) and strongly agitated using 320 g of methanol, and then left to stand (primary). After the newly-obtained supernatant was removed again, a precipitate was dissolved in 80 g of propyleneglycol monomethylether acetate (PGMEA) (secondary). When the primary and secondary processes were regarded one-cycle purification process, the purification process was performed three times in total.

The purified polymer was dissolved in 80 g of propyleneglycol monomethylether acetate (PGMEA), and methanol and distilled water left in the solution were removed under a reduced pressure, obtaining a polymer represented by the following Chemical Formula 1 g.

The polymer was measured regarding weight average molecular weight and polydispersity using a gel permeation chromatography (GPC) in tetrahydrofuran. As a result, it had a weight average molecular weight of 4,000 and polydispersity of 1.75.

[Chemical Formula 1g]

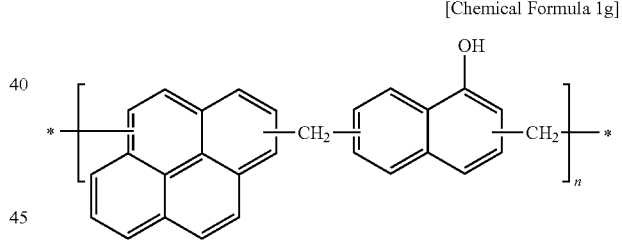

Preparation of a Hard Mask Composition

Example 1

0.8 g of the aromatic ring-containing compound according to Synthesis Example 1 was dissolved in 9 g of propyleneglycol monomethylether acetate (PGMEA). The solution was filtered, preparing a hard mask composition.

Example 2

A hard mask composition was prepared according to the same method as in Example 1 by using the aromatic ring-containing compound of Synthesis Example 2 instead of the aromatic ring-containing compound of Synthesis Example 1.

Example 3

A hard mask composition was prepared according to the same method as in Example 1 using the aromatic ring-containing compound of Synthesis Example 3 instead of the aromatic ring-containing compound of Synthesis Example 1.

Example 4

A hard mask composition was prepared according to the same method as in Example 1 using the aromatic ring-containing compound of Synthesis Example 4 instead of the aromatic ring-containing compound of Synthesis Example 1.

Example 5

A hard mask composition was prepared according to the same method as in Example 1 using the aromatic ring-containing compound of Synthesis Example 5 instead of the aromatic ring-containing compound of Synthesis Example 1.

Comparative Example 1

A hard mask composition was prepared according to the same method as in Example 1 using the aromatic ring-containing compound of Comparative Synthesis Example 1 instead of the aromatic ring-containing compound of Synthesis Example 1.

Comparative Example 2

A hard mask composition was prepared according to the same method as in Example 1 using the aromatic ring-containing compound of Comparative Synthesis Example 2 instead of the aromatic ring-containing compound of Synthesis Example 1.

Formation of Hard Mask Layer

Hard mask layers, of about 2,500 Å-thick each, were formed by respectively spin-coating the hard mask compositions of Examples 1 to 5 and Comparative Examples 1 and 2 onto silicon wafers where silicon nitride layer was formed, and baking them at 400° C. for 60 seconds.

Evaluation-1

The refractive indices (n) and extinction coefficients (k) of the hard mask layers formed of the hard mask compositions prepared according to Examples 1 to 5 were measured. The refractive indices and extinction coefficients were measured using an ellipsometer (produced by J.A. Woollam Company) while radiating lights of 193 nm and 248 nm.

The results shown in the following Table 1.

TABLE 1

| | Optical property at 193 nm | | Optical property at 248 nm | |
|---|---|---|---|---|
| | Refractive index (n) | Extinction coefficient (k) | Refractive index (n) | Extinction coefficient (k) |
| Example 1 | 1.36 | 0.46 | 1.86 | 0.31 |
| Example 2 | 1.39 | 0.78 | 1.78 | 0.52 |
| Example 3 | 1.34 | 0.77 | 1.73 | 0.45 |
| Example 4 | 1.23 | 0.55 | 1.94 | 0.43 |
| Example 5 | 1.41 | 0.73 | 1.79 | 0.53 |

Referring to Table 1, the hard mask layers formed of the hard mask compositions prepared according to Examples 1 to 5 showed refractive indices (n) and extinction coefficients (k) that are appropriate for a hard mask layer with respect to lights of 193 nm and 248 nm.

Formation of Resist Pattern

Hard mask layers having a thickness of 5,000 Å were formed by applying the hard mask compositions of Examples 1 to 5 and Comparative Examples 1 and 2 onto silicon wafers where silicon nitride layer was formed, respectively, through a spin coating process, and baking them at 400° C. for 60 seconds.

The upper surface of each hard mask layer was coated with a ArF-dedicated resist, and then the hard mask layers were baked at 110° C. for 60 seconds, and exposed using ASML 1250 (FN70 5.0 active, NA 0.82), which is ArF exposure equipment. Subsequently, development with a 2.38 wt % tetramethylammonium hydroxide (TMAH) aqueous solution was performed to provide resist patterns.

Evaluation-2

Exposure latitude (EL) margins according to variation of exposure amount and depth of focus (DoF) margins according to variation of distance from a light source were observed. Also, whether undercut occurred in the patterned hard mask layer or not was observed using an FE-SEM.

The results are presented in the following Table 2.

TABLE 2

| | EL margin (ΔCD/exposure energy, mJ) | DoF margin (μm) | Whether under-cut has occurred |
|---|---|---|---|
| Example 1 | 0.6 | 0.6 | X |
| Example 2 | 0.6 | 0.7 | X |
| Example 3 | 0.6 | 0.7 | X |
| Example 4 | 0.7 | 0.6 | X |
| Example 5 | 0.6 | 0.7 | X |
| Comparative Example 1 | 0.1 | 0.1 | ○ |
| Comparative Example 2 | 0.3 | 0.4 | X |

Referring to Table 2, the hard mask layer formed of the hard mask compositions prepared according to Examples 1 to 5 showed high EL margins and DoF margins, compared with the hard mask layer formed of the hard mask composition prepared according to Comparative Examples 1 and 2. Also, no undercut was observed in the hard mask layers formed of the hard mask compositions prepared according to Examples 1 to 5. Instead, excellent profiles were observed.

Formation of Pattern

Dry-etching of the silicon nitride layer was performed using the patterned hard mask layer as a mask, and a mixed gas of $CHF_3/CF_4$ Subsequently, the remaining organic materials were all removed using oxygen ($O_2$) gas.

Evaluation-3

The patterns of the hard mask layer and the silicon nitride layer were examined using an FE-SEM. The results are presented in the following Table 3.

TABLE 3

| | Pattern profile of hard mask | Pattern profile of silicon nitride layer |
|---|---|---|
| Example 1 | Vertical shape (anisotropic) | Vertical shape (anisotropic) |
| Example 2 | Vertical shape (anisotropic) | Vertical shape (anisotropic) |
| Example 3 | Vertical shape (anisotropic) | Vertical shape (anisotropic) |
| Example 4 | Vertical shape (anisotropic) | Vertical shape (anisotropic) |
| Example 5 | Vertical shape (anisotropic) | Vertical shape (anisotropic) |
| Comparative Example 1 | Tapered shape | Tapered shape |
| Comparative Example 2 | Vertical shape (anisotropic) | Vertical shape (anisotropic) |

It may be seen from Table 3 that the hard mask layer formed of the hard mask composition prepared according to Comparative Example 1 and silicon nitride layer under the hard mask layer were not isotropically patterned in vertical shapes but were tapered, whereas the hard mask layers formed of the hard mask compositions prepared according to Examples 1 to 5 and the silicon nitride layers under the hard mask layers were all isotropically patterned in vertical shapes.

It may be seen that when the hard mask compositions prepared according to Examples 1 to 5 were used, resistance against the etching gas was sufficient and the etching process was performed excellently. On the other hand, when the hard mask composition prepared according to Comparative Example 1 was used, the resistance against the etching gas was not sufficient and this led to insufficient etching selectivity to pattern the silicon nitride layer in an appropriate shape.

By way of summation and review, a resist used in some lithography imaging processes may not provide sufficient resistance to effectively transfer a predetermined pattern to a layer on the other side of the resist in a subsequent etching process. Therefore, when an ultrathin film resist layer is needed, when the material on a different surface to be etched is thick, when a considerable etching depth is required, and/or when a particular etchant is used for the material on a different surface is needed, a hard mask layer may be used as an intermediate layer between the resist layer and the material on a different surface that may be patterned through transfer from the patterned resist. The hard mask layer may accommodate the pattern from the patterned resist layer, while withstanding an etching process that is used to transfer the pattern onto the material of a different surface. Thus, it is desirable for the hard mask layer to provide high etch selectivity and sufficient resistance against multiple etching processes, and minimize reflectivity between the resist and a different surface layer. A pattern formed using a process that incorporates a hard mask layer may have improved optical properties.

As described above, an embodiment provides a hard mask composition that may be used to form a hard mask layer having high etching selectivity and improved optical properties. The hard mask composition may provide high etching selectivity and improved optical properties while ensuring resistance for multi-etching processes. Another embodiment provides a method for forming a pattern of the hard mask composition. Another embodiment provides a semiconductor integrated circuit device including a pattern formed using a method that employs a hard mask composition according to an embodiment.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A hard mask composition, comprising:
a solvent and an aromatic ring-containing compound represented by the following Chemical Formula 1:

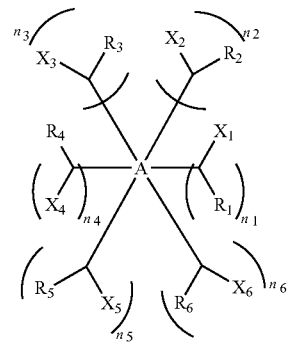

[Chemical Formula 1]

wherein, in Chemical Formula 1,

A is a substituted or unsubstituted aromatic cyclic group, $R_1$ to $R_6$ are each independently a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 an arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, $X_1$ to $X_6$ are each independently a substituted or unsubstituted C1 to C20 alkyl group, a substituted or unsubstituted C3 to C30 cycloalkyl group, a substituted or unsubstituted C6 to C30 aryl group, a substituted or unsubstituted C1 to C30 alkoxy group, a substituted or unsubstituted C1 to C20 alkylamine group, an amino group, a hydroxy group, or a combination thereof, $n_1$ to $n_6$ are each independently 0 or 1, and $1 \leq n_1+n_2+n_3+n_4+n_5+n_6 \leq 6$.

2. The composition as claimed in claim 1, wherein the A is one selected from substituted or unsubstituted aromatic ring groups shown in the following Group 1:

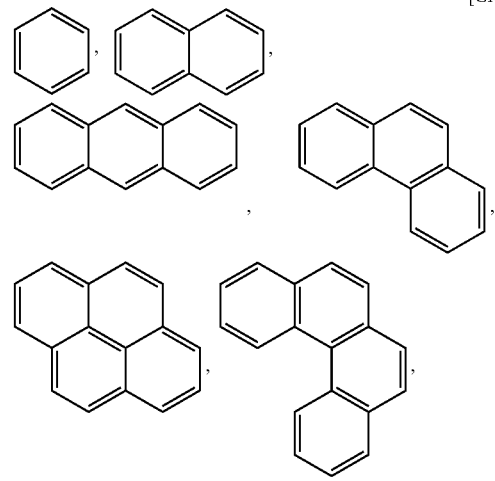

[Group 1]

-continued

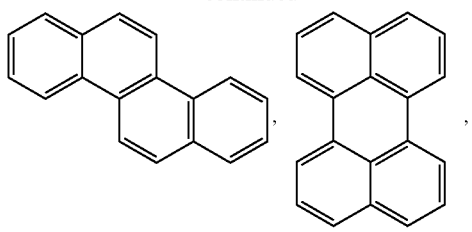

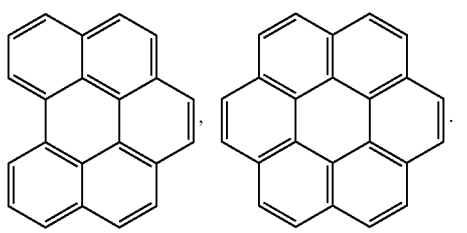

3. The composition as claimed in claim 1, wherein the aromatic ring-containing compound is a monomer.

4. The composition as claimed in claim 1, wherein the aromatic ring-containing compound has a molecular weight of about 300 to about 4,000.

5. The composition as claimed in claim 1, wherein the aromatic ring-containing compound and the solvent are included in an amount of about 1 wt % to about 20 wt % and about 80 wt % to about 99 wt %, based on the total amount of the hard mask composition, respectively.

6. The composition as claimed in claim 1, wherein the solvent includes at least one selected from propyleneglycol monomethyl etheracetate (PGMEA), propyleneglycol monomethylether (PGME), cyclohexanone, and ethyl lactate.

7. The composition as claimed in claim 1, wherein the aromatic ring-containing compound represented by Chemical Formula 1 is selected from compounds represented by the following Chemical Formulae 1a-e:

[Chemical Formula 1a]

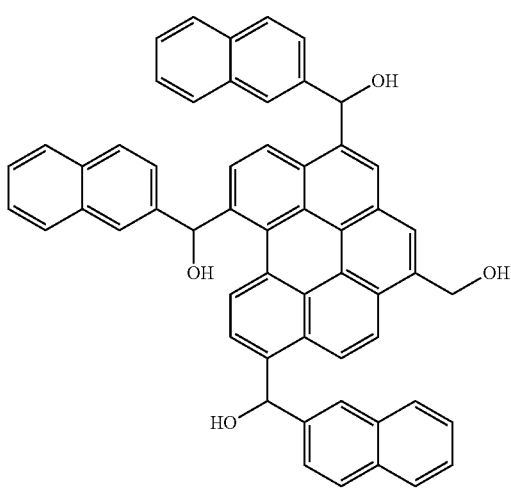

-continued

[Chemical Formula 1b]

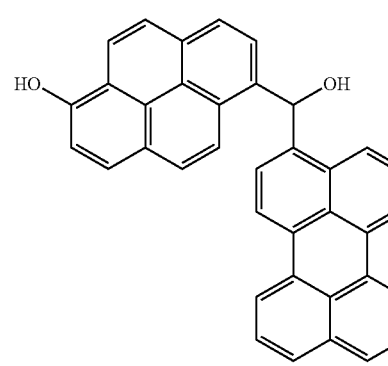

[Chemical Formula 1c]

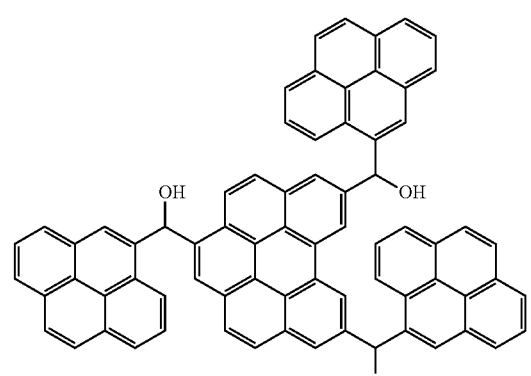

[Chemical Formula 1d]

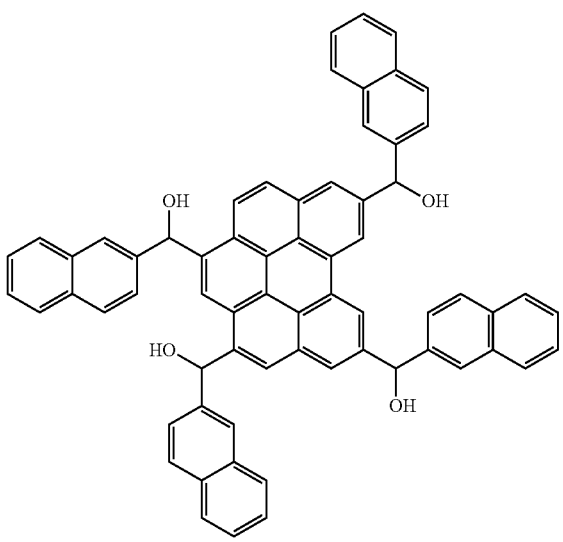

[Chemical Formula 1e]

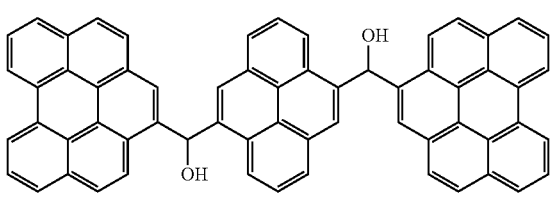

8. A method for forming a pattern, the method comprising:
providing a material layer on a substrate;
forming a hard mask layer using the hard mask composition as claimed in claim 1;

forming a resist layer on the hard mask layer;
forming a resist pattern by exposing and developing the resist layer;
selectively removing the hard mask layer by using the resist pattern; and
exposing a part of the material layer; and etching the exposed part of the material layer.

9. The method as claimed in claim 8, wherein the hard mask layer is formed through a spin-on-coating process using the hard mask composition.

10. The method as claimed in claim 8, further comprising forming an auxiliary layer containing silicon over the material layer before the resist layer is formed.

11. The method as claimed in claim 10, further comprising forming a bottom antireflective coating layer (BARC) before the hard mask layer is formed.

12. A semiconductor integrated circuit device comprising a pattern formed through the method as claimed in claim 8.

* * * * *